United States Patent
Nasu et al.

(10) Patent No.: US 6,765,938 B2
(45) Date of Patent: Jul. 20, 2004

(54) SYSTEM FOR CONTROLLING WAVELENGTH OF LASER BEAM

(75) Inventors: Hideyuki Nasu, Tokyo (JP); Takehiko Nomura, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 11 days.

(21) Appl. No.: 10/102,908

(22) Filed: Mar. 22, 2002

(65) Prior Publication Data

US 2002/0196822 A1 Dec. 26, 2002

(30) Foreign Application Priority Data

Apr. 23, 2001 (JP) .................................... 2001-123797

(51) Int. Cl.[7] .................................... H01S 3/13

(52) U.S. Cl. ................................ 372/32; 372/34

(58) Field of Search .................. 372/29.02, 29.01, 372/29.011, 29.014, 32, 34, 36, 38.01, 38.03, 38.07, 33

(56) References Cited

U.S. PATENT DOCUMENTS

| | | | | |
|---|---|---|---|---|
| 6,147,795 A | * | 11/2000 | Derbyshire et al. | 359/337 |
| 6,324,197 B1 | * | 11/2001 | Suda | 372/38.01 |
| 6,501,774 B2 | * | 12/2002 | Kuwahara et al. | 372/32 |
| 6,529,534 B1 | * | 3/2003 | Yasuda | 372/32 |
| 2001/0021207 A1 | * | 9/2001 | Serizawa | 372/32 |

* cited by examiner

*Primary Examiner*—Paul Ip
*Assistant Examiner*—Tuan N. Nguyen
(74) *Attorney, Agent, or Firm*—Oblon, Spivak, McClelland, Maier & Neustadt, P.C.

(57) ABSTRACT

The present invention provides a system for controlling a wavelength of laser light comprising: a light-emitting device for outputting laser light; means for regulating a temperature of said light-emitting device; a wavelength monitor for receiving the laser light transmitted from said light-emitting device through an optical filter, said optical filter having a periodic wavelength-transmissivity intensity curve; a controlling unit for providing a control signal to control an current supplied to said temperature regulating means responsive to a output signal from said wavelength monitor; said control signal having a polarity; and means for switching the polarity of said control signal.

27 Claims, 7 Drawing Sheets

SYSTEM FOR CONTROLLING WAVELENGTH OF LASER BEAM

BACKGROUND OF THE INVENTION

The present invention relates to a system for controlling a wavelength of laser beam emitted by a signal light source for wavelength stability in the field of a wavelength division multiplexing (WDM) optical communication system.

Traditionally, a single-mode laser (e.g., distributed feedback (DFB) laser) may be employed as a signal light source for use with WDM system. In a dense WDM (commonly referred to as "DWDM") system, any deviation of an output or lasing wavelength of the light source from a predetermined wavelength can lead to cross talks between adjacent optical channels in a such a manner as to deteriorate the optical signals. To avoid such a problem, there is a need for providing a system for effectively and efficiently adjusting the wavelength of the output laser light from the signal light source for wavelength stability.

SUMMARY OF THE INVENTION

The present invention provides a system for controlling a wavelength of laser light comprising:
- a light-emitting device for outputting laser light; means for regulating a temperature of said light-emitting device;
- a wavelength monitor for receiving the laser light transmitted from said light-emitting device through an optical filter, said optical filter having a periodic wavelength-transmissivity intensity curve;
- a controlling unit for providing a control signal to control an current supplied to said temperature regulating means responsive to a output signal from said wavelength monitor; said control signal having a polarity; and
- means for switching the polarity of said control signal.

DETAILED DESCRIPTION OF THE PREFERRED EMBODIMENT

Embodiments of the present invention will now be described with reference to the drawings, as compared with a prior art arrangement.

Figure 4:
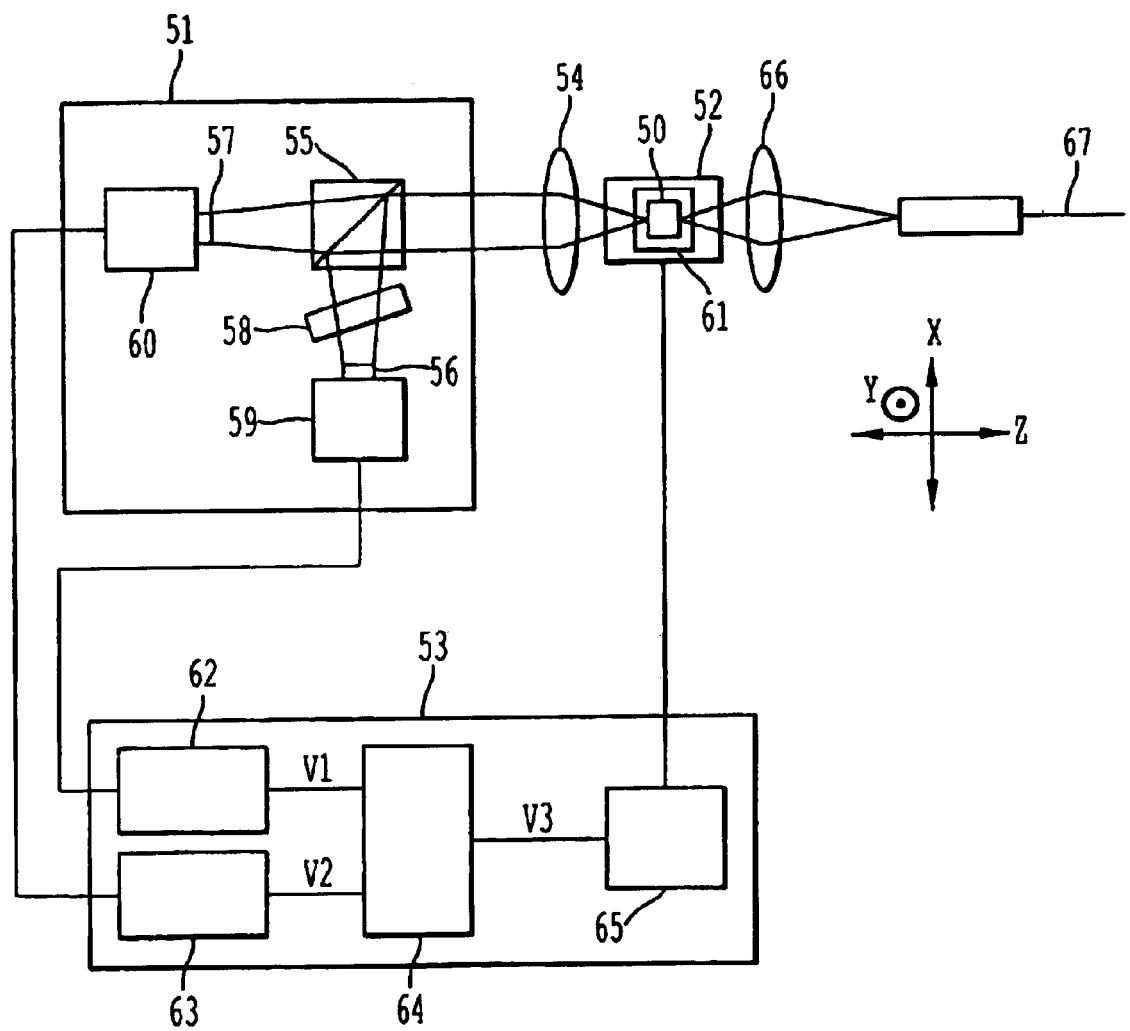
FIG. 4 is a schematic representation illustrating a conventional system for controlling a wavelength of laser light.

FIG. 4 is a schematic representation illustrating a conventional system for controlling a wavelength of laser light. As shown in FIG. 4, the conventional system for controlling the wavelength of laser light comprises a wavelength monitor 51 for receiving and monitoring a laser light generated by a light-emitting device 50 such as a semiconductor laser diode or the like, a temperature regulator or temperature regulating element 52 such as Peltier device or the like, for regulating an operating temperature of the light-emitting device 50, and a controller 53 for controlling the temperature regulator 52 in such a manner as to control an output or lasing wavelength of the light emitter 50 to a target or desired wavelength in response to an output signal of the wavelength monitor 51.

The wavelength monitor 51 may be located either inside or outside a package (not shown) for hermetically enclosing the light emitter device 50. The wavelength monitor 51 comprises a half mirror 55 for dividing a laser light which is collimated by a collimator lens 54 after have been outputted from the rearward end face of the light emitter 50, into two portions thereof, a first light receiving element 56 such as a photodiode (PD) for receiving the light portion reflected by the half mirror 55, a second light receiving element 57 such as a photodiode for receiving the light portion transmitted through the half mirror 55, and an optical filter 58 disposed between the half mirror 55 and the first light receiving element 56. The first and second light receiving elements 56 and 57 are fixedly mounted on first and second PD carriers 59 and 60, respectively. By way of example, the optical filter 58 may be in the form of a Fabry-Perot etalon. Fixedly mounted on the top of the temperature regulating element 52 is a LD carrier 61 by which the light-emitting element 50 is carried.

The controller 53 comprises a first converter 62 for converting a first PD current generated by the first light receiving element 56 to a first voltage V1, a second converter 63 for converting a second PD current generated by the second light receiving element 57 to a second voltage V2, a comparator 64 for comparing the first and second voltages V1 and V2 and generating an output voltage signal V3 which is representative of the difference between the first and second voltages V1 and V2, and a current generator 65 coupled to the temperature regulating element 52 for selectively producing an current signal responsive to the output differential voltage V3 of the comparator 64 to either increase or decrease the temperature of the temperature regulating element 52.

The laser light outputted from the forward end face of the light-emitting element 50 is condensed by the condenser lens 9 and then passed into an optical fiber 67 for optical communication.

On the other hand, the laser light outputted from the rear end face of the light-emitting element 50 is collimated by the collimator lens 54 and then impinges on the half mirror 55 which divides into two light portions, one being directed to the Z-axis direction (i.e., a light transmission direction), the other directed to the X-axis direction (i.e., a light reflection direction) which is perpendicular to the Z-axis direction. The first laser light portion propagating along the X-axis direction is received by the first light receiving element 56 via the optical filter 58, while the second laser light portion reflected by the half mirror and directed to the Z-axis direction is received by the second light receiving element 57. Then, the first and second receiving elements 56 and 57 generate first and second PD current signals, respectively, which are separately inputted to the controller 53.

As can be seen, in the controlling unit 53, the first and second PD currents are converted by the first and second converters 62 and 63 to the first and second voltages V1 and V2 which are inputted to the comparator 64. As described above, the comparator 64 outputs the voltage V3 representative of the difference between the first and second output voltages V1 and V2 of the first and second converters 62 and 63, respectively. Then, the output voltage signal V3 of the comparator 64 is passed to the current generator 65 which then selectively outputs the current signal responsive to the output differential voltage V3 of the comparator 64 to either increase or decrease the temperature of the temperature regulating element 52, thus making it possible to control the output wavelength of the laser light generated by the light emitter 50.

Figure 5:
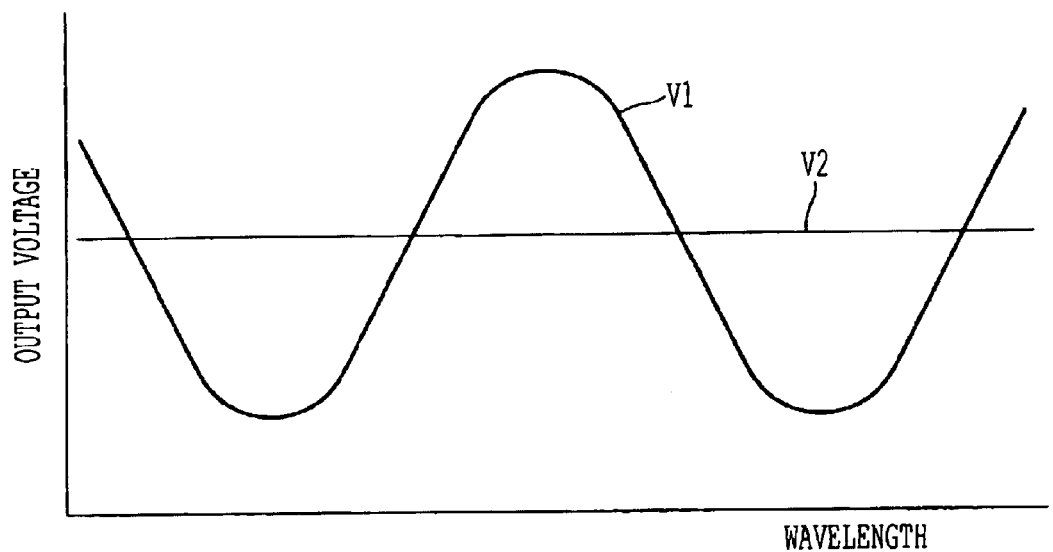
FIG. 5 is a graph showing respective output voltages of first and second converters for converting currents generated by first and second photodiodes to voltages to be utilized to control a temperature regulator associated with a light-emitting device.
Figure 6:
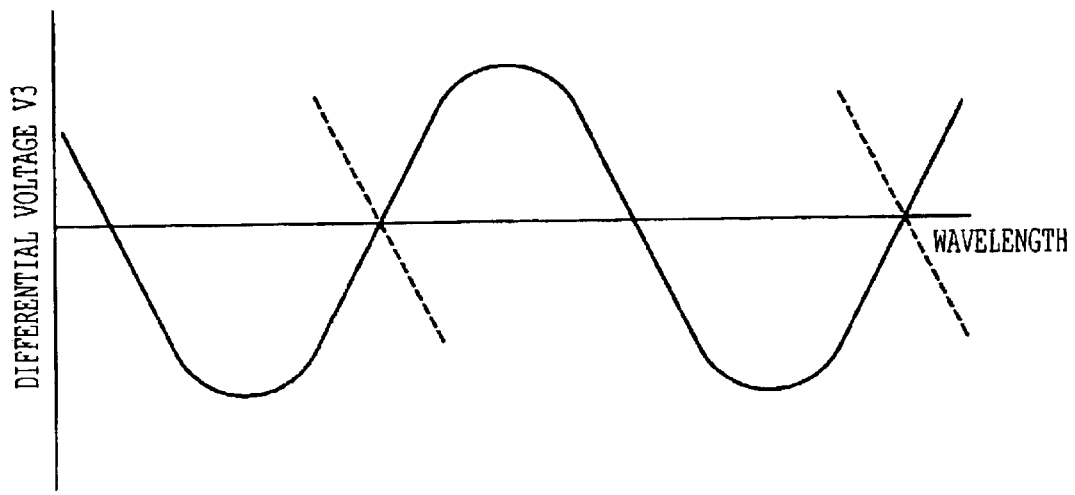
FIG. 6 is a graph similar to FIG. 5, but showing the wavelength characteristics of the difference between the output voltages of the first and second converters.

It is known to those skilled in the art that there is a correlation between the output voltages V1 and V2 of the converters 62 and 63, and the wavelength characteristics of the optical filter 58. FIG. 5 illustrates an amplitude of each of the output voltages V1 and V2 of the converters 62 and 63, respectively, vs. wavelength. FIG. 6 illustrates a periodic curve showing the difference, V3, in amplitude between the output voltages V1 and V2 of the converters 62 and 63, respectively. It is assumed that the current generator 65 can provide a positive current to the temperature regulating element 52 to increase its temperature when the differential voltage V3 is positive, and a negative current to the temperature regulating element 52 to decrease its temperature when the differential voltage V3 is negative. If the output wavelength become longer than the desired wavelength (often referred to as lock point) due to the increase in the operating temperature of the light-emitting element 50 as described above, during the time when the differential voltage curve has a slope descending to the right, the differential voltage V3 may change to the negative value via zero value, which can result in the generation of the negative current which is injected into the temperature regulating element 52 so as to decrease the temperature of the light-emitting element 50. On the other hand, if the output wavelength become shorter than the desired wavelength due to the decrease in the operating temperature of the light-emitting element 50, the differential voltage V3 may change to the positive value, which can result in the generation of the positive current which is injected into the temperature regulating element 52 so as to increase the operating temperature of the light-emitting element 50. Thus, it is possible to stabilize the output wavelength of the laser light from the light source in such a manner that the differential voltage value becomes zero.

Figure 7:
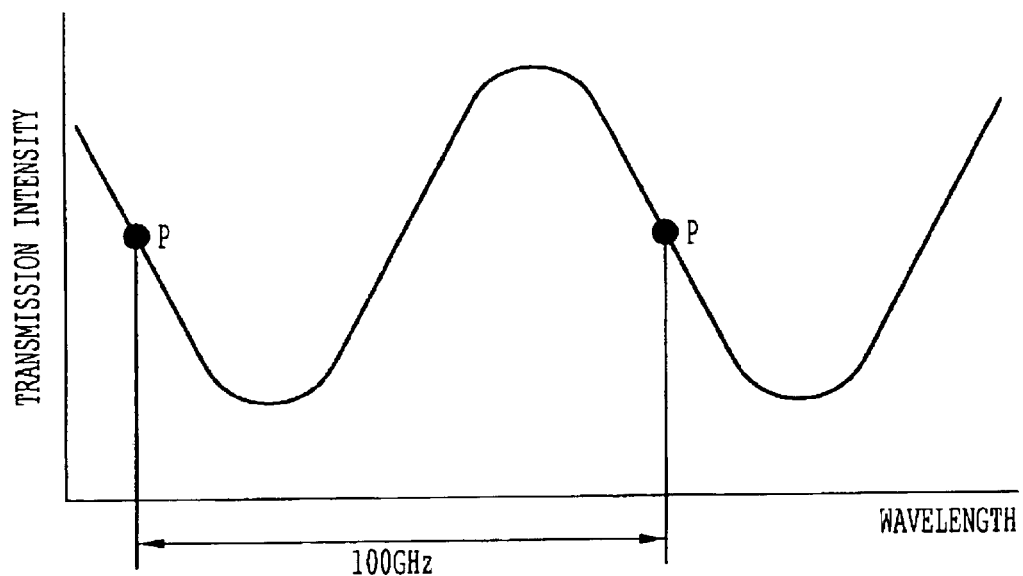
FIG. 7 is a graph showing a relationship between wavelength characteristics vs. a predetermined wavelength capable of being stabilized by a conventional optical filter.

Recently, an increasing demand for expanding data transmission capacity has required narrowing of the spacing of the wavelengths between adjacent optical signals in order to increase the number of the optical signals for increased multiplexed density. However, in the conventional wavelength controlling system, it is not possible to stabilize the output wavelength of the laser light outputted from the light-emitting device in a case where the differential voltage V3 curve has a slope directed to one direction (ascending to the right in the case as described above), as opposed to the case where the differential voltage V3 curve has a slope directed to opposite direction (descending to the right). In light of the foregoing, as shown in FIG. 7, the interval between appointed wavelengths (lock-point P) for which the wavelength can be stabilized is wide (for example, 100 GHz), wherein it was difficult for a signal light source of the WDM system to be made dense in terms of wavelengths.

Also, it may be considered that the spacing between wavelengths of an optical filter 58 is narrowed. However, for example, as regards the Fabry-Perot etalon, it is necessary to increase the length thereof in the optical axis direction, which can result in an increase of amount of the matrix material and thus provision of upsized Fabry Perot etalon. There is a problem in that it is difficult to make the optical module compact.

In view of the foregoing, it is therefore an object of the embodiment of the present invention to provide a laser beam wavelength controlling apparatus that is capable of narrowing the spacing between appointed wavelengths that can be stabilized, without any modification to the function of the existing optical monitoring system.

Figure 1:
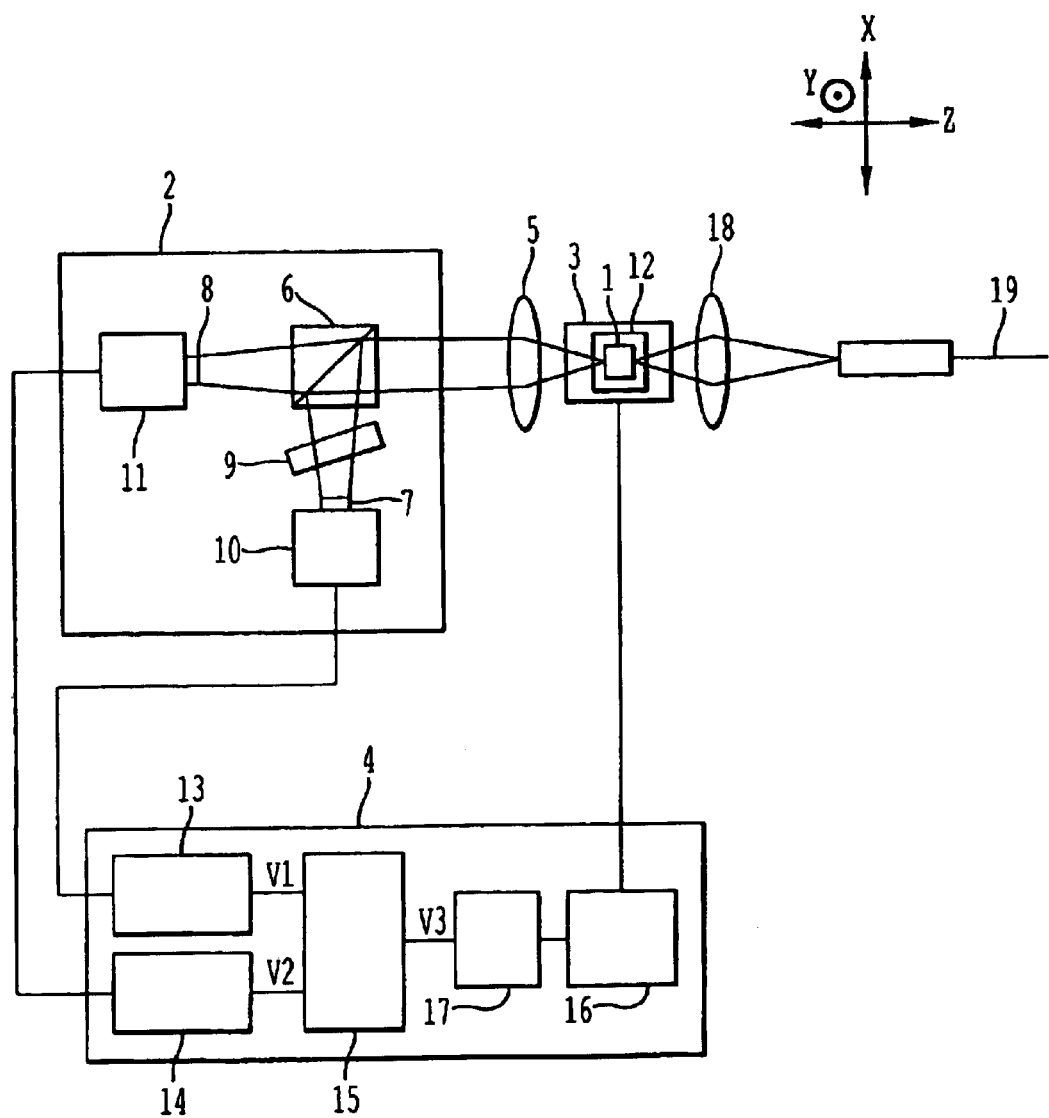
FIG. 1 is a schematic representation illustrating a system for controlling a wavelength of laser light in accordance with a first embodiment of the present invention.

FIG. 1 is a schematic representation illustrating a system for controlling a wavelength of laser light constructed according to a first embodiment of the present invention.

As shown in FIG. 1, the first embodiment of the system for controlling the wavelength of laser light comprises a wavelength monitor 2 for receiving and monitoring a laser light outputted from the rear end face (on the left side as viewed in FIG. 1) of a light-emitting device 1 such as a semiconductor laser diode or the like, a temperature regulating element 3 such as Peltier device or the like, for regulating an operating temperature of the light-emitting device 1, and a controller 4 for controlling the first temperature regulator 3 in such a manner as to control an output or lasing wavelength of the light emitter 1 to a desired wavelength in response to an output signal of the wavelength monitor 2.

Figure 2:
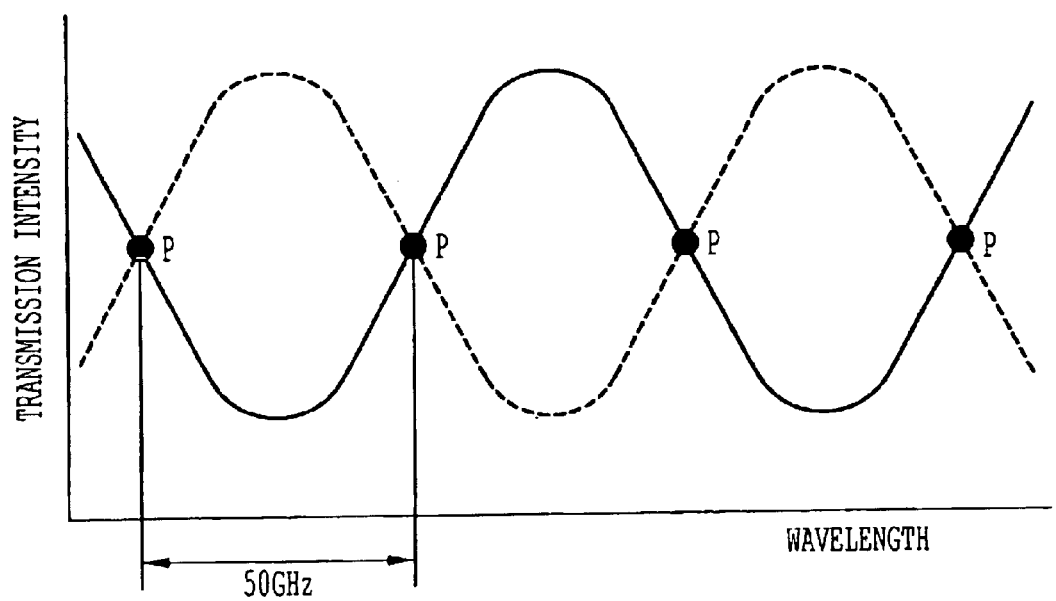
FIG. 2 is a graph showing a relationship between wavelength characteristics vs. a predetermined wavelength capable of being stabilized by an optical filter of the first embodiment of the present invention.

The wavelength monitor 2 may be located either inside or outside a package (not shown) for hermetically enclosing the light emitter device 1. The wavelength monitor 2 comprises a half mirror 6 for dividing a laser light which is collimated by a collimator lens 5 after emanating from the rearward end face of the light emitter 1, into two portions thereof, a first light receiving element 7 such as a photodiode or the like for receiving the portion of the laser light reflected by the half mirror 6, a second light receiving element 8 such as a photodiode or the like for receiving the portion of the light transmitted through the half mirror 6, and a plurality of optical filters 9 disposed between the half mirror 6 and the first light receiving element 7. The first and second light receiving elements 7 and 8 are fixedly mounted on first and second PD carriers 10 and 11, respectively. By way of example, the optical filter 9 may be in the form of a wedge-shaped type of Fabry-Perot etalon of a wedge-shaped type as shown in FIG. 2 which produces a repeatedly periodically transmission intensity indicated by a periodic curve as shown in FIG. 2 including alternating upwardly and downwardly rightward sloping portions equally spaced from one another.

Fixedly mounted on the top of the temperature regulating element 3 is a LD carrier 12 by which the light-emitting element 1 is carried.

The controlling unit 4 comprises a first converter 13 for converting a first PD current generated by the first light receiving element 7 to a first voltage V1, a second converter 14 for converting a second PD current generated by the second light receiving element 8 to a second voltage V2, a comparator 15 for comparing the first and second voltages V1 and V2 and generating an output voltage signal (monitoring signal) V3 which is representative of the difference between the first and second voltages V1 and V2, a current generator 16 coupled to the temperature regulating element 3 for selectively producing an current signal responsive to the output differential voltage V3 of the comparator 15 to either increase or decrease the temperature of the temperature regulating element 3, and a switch 17 for providing change in the polarity of the differential voltage V3 depending on the particular wavelength.

More particular, the current generator 16 can be arranged to produce a current proportional to the differential voltage V3.

The switch 17 is positioned between the comparator 15 and the current generator 16 for switching the polarity of the differential voltage V3 between the positive and the negative.

The laser light outputted from the forward end face of the light-emitting element 1 is condensed by the condenser lens 18 and then passed into an optical fiber 19 for transmission.

On the other hand, the laser light outputted from the rear end face of the light-emitting element 1 is collimated by the collimator lens 5 and then impinges on the half mirror 6 which divides into two portions, one being directed to the Z-axis direction (i.e., a light transmission direction), the other directed to the X-axis direction (i.e., a light reflection direction) which is perpendicular to the Z-axis direction. The first laser light portion propagating along the X-axis direction is received by the first light receiving element 7 via the optical filter 9, while the second laser light portion reflected by the half mirror and directed to the Z-axis direction is received by the second light receiving element 8. Then, the first and second receiving elements 7 and 8 generate first and second PD current signals, respectively, which are separately inputted to the controller 4.

In the controlling unit 4, the first and second PD currents are converted by the first and second converters 13 and 14 to the first and second voltages V1 and V2 which are inputted to the comparator 64. The comparator 15 outputs the voltage V3 representative of the difference between the first and second output voltages V1 and V2 of the first and second converters 13 and 14, respectively. The output differential voltage V3 signal from the comparator 15 is inputted to the switch 17 which can then change the polarity of the difference V3 between the positive and the negative depending on the slope of the transmission light intensity—wavelength curve to send the differential voltage signal to the current generator. The current generator 16 then selectively outputs the current signal responsive to the output differential voltage V3 of switch 17 to either increase or decrease the temperature of the temperature regulating element 3, thus making it possible to control the output wavelength of the laser light generated by the light emitter 1.

Again, it is assumed that the current generator 16 can inject a positive current into the temperature regulating element 3 to increase its temperature when the differential voltage V3 is positive, and a negative current into the temperature regulating element 3 to decrease its temperature when the differential voltage V3 is negative. If the output wavelength become longer than the desired wavelength (lock point) due to the increase in the temperature of the light-emitting element 1 as described above, during the time when the differential voltage curve has a slope descending to the right, the differential voltage V3 may change to the negative value via zero value, which can result in the generation of the negative current which is injected into the temperature regulating element 3 so as to decrease the temperature of the light-emitting element 1. On the other hand, if the output wavelength become shorter than the target wavelength due to the decrease in the temperature of the light-emitting element 1, the differential voltage V3 may change to the positive value, which can result in the generation of the positive current which is injected into the temperature regulating element 1 so as to increase the temperature of the light-emitting element 1. Thus, it is possible to stabilize the output wavelength of the light source in such a manner that the differential voltage value becomes zero.

Changeover of the polarities (positive and negative) of a differential voltage V3 by using a switch 17 contributes to an inverting of the rightward descending slope or inclination and rightward ascending slope or inclination of a wavelength-transmission light intensity characteristic as shown by the dashed line in FIG. 2. That is, the wavelength can be stabilized even at rightward raising sections of the wavelength-transmission light intensity characteristic. As a result, as shown in FIG. 2, the interval between appointed wavelengths that can be stabilized (lock-points: P) is narrowed to one half (for example, 50 Ghz), wherein the embodiment can be used as a light source for a denser WDM system.

It will be appreciated to those skilled in the art that the principle of the invention can be applied to the existing system by only adding a part of the circuits without any modification to the optical module section therein. Accordingly, it is inexpensive and easy to construct the system.

Where such a laser beam wavelength adjusting apparatus is used for a light source of a WDM system, an optical filter 9 can produce a laser beam having the above-described set spacing between wavelengths if one cycle of the wavelength-transmission light intensity characteristic is established so that it becomes greater by two times than the set spacing between wavelengths, which is requested for a laser beam.

Figure 3:
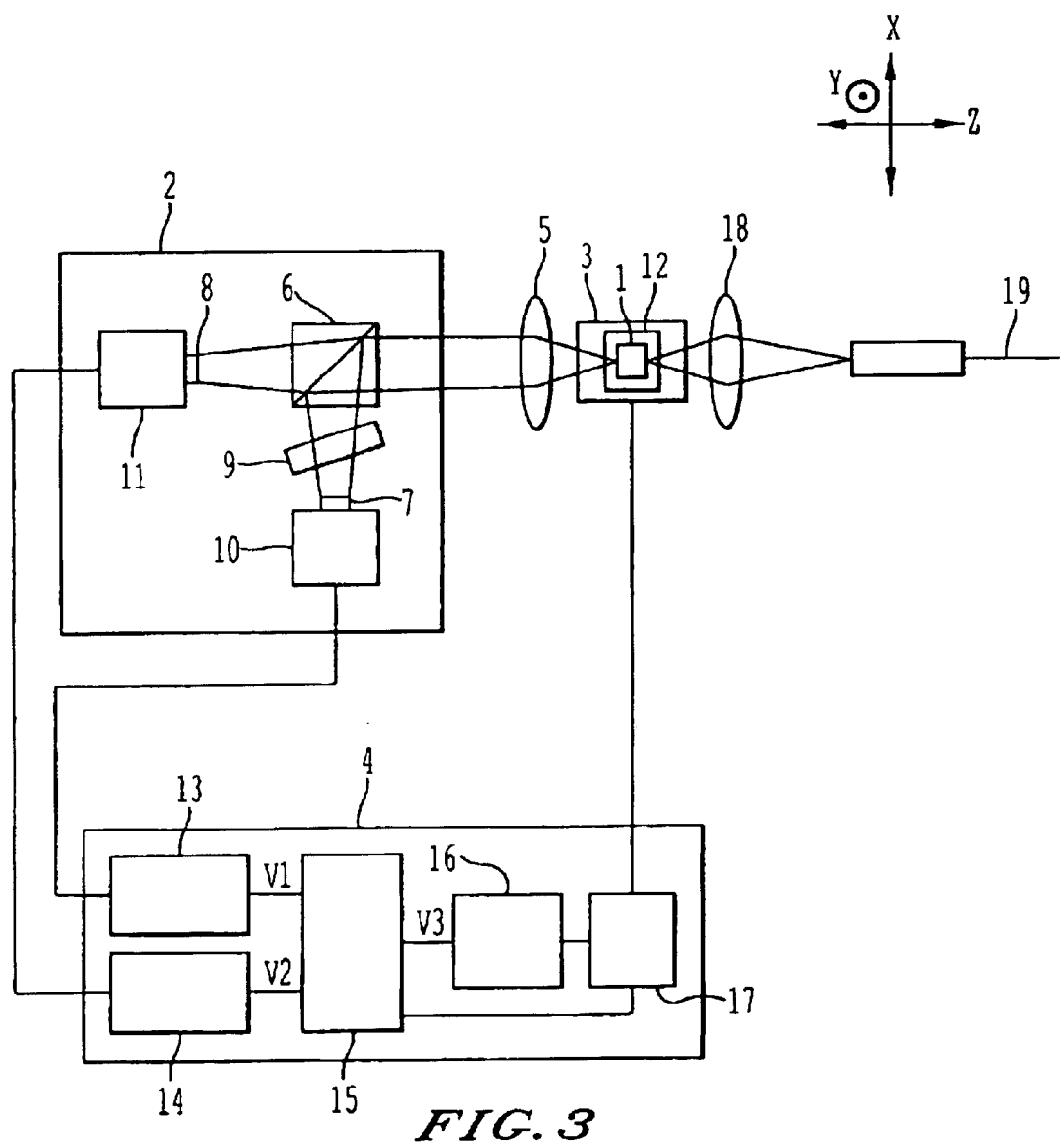
FIG. 3 is a schematic representation illustrating a system for controlling a wavelength of laser light in accordance with a second embodiment of the present invention.

FIG. 3 is a view explaining a laser beam wavelength adjusting apparatus according to a second embodiment of the invention. As shown in FIG. 3, the switch 17 of the second embodiment is disposed between the current generator 16 and the temperature regulator element 3 and changes over a supply current, which is outputted from the current generator 16, to an appropriate supply current.

According to the second embodiment, as in the first embodiment, since the supply current outputted from the current generator 16 can be changed over to an appointed supply current by the switch 17 not only in a case where the inclination of the differential voltage V3 is inclined rightward, but also in a case where the inclination is raised rightward, it is possible to stabilize the wavelengths. As a result, as shown in FIG. 2, the spacing between appointed wavelengths that can be stabilized (lock-points: P) is narrowed to one half (for example, 50 Ghz), wherein the embodiment can be used as a light source for a denser WDM system.

Again, it will be appreciated to those skilled in the art that the principle of the invention can be applied to the existing system by only adding a part of the circuits without any modification to the optical module section therein. Accordingly, it is inexpensive and easy to construct the system.

The present invention is not limited to the above-described embodiments and it may be subjected to various modifications without departing from the scope and spirit of the invention as defined in the claims.

For example, a prism may be employed instead of a half mirror 6. Also, the periodic wavelength-transmissivity light intensity characteristic of the optical filter 9 may be of other shapes such as a sawtooth-like waveform or the like.

What is claimed is:

1. A system for controlling a wavelength of a laser light comprising:

a light-emitting device configured to output the laser light;

a temperature regulator configured to controllably regulate a temperature of said light-emitting device;

an optical filter positioned in a transmission path of at least a portion of the laser light from said light-emitting device, said optical filter having a predetermined periodic wavelength-transmissivity intensity characteristic;

a wavelength monitor positioned to receive the at least a portion of the laser light after being passed through said optical filter and configured to produce an output signal as a function of said predetermined periodic wavelength-transmissivity intensity characteristic, said output signal having a positively sloped portion and a negatively sloped portion as a function of wavelength;

a control unit configured to perform a control function based only on one of the positively sloped portion and said negatively sloped portion of said output signal but not both, said control unit configured to provide a control signal for controlling said temperature regulator in response to receiving said output signal of said wavelength monitor, said control signal have a polarity; and a switch configured to change the polarity of the control signal applied to the temperature regulator when a value of the output signal meets a predetermined criteria of having a slope that is opposite to a slope on which the control unit is configured to perform the control function.

2. The system of claim 1, wherein:

said predetermined periodic wavelength-transmissivity intensity characteristic of said optical filter includes a positively sloped portion and a negatively sloped portion; and said switch being configured to change the polarity of the control signal only when the value of the output signal corresponds with the positively-sloped portion of the predetermined periodic wavelength-transmissivity intensity characteristic.

3. The system of claim 1, wherein:

said predetermined periodic wavelength-transmissivity intensity characteristic of said optical filter includes a positively sloped portion and a negatively sloped portion; and said switch being configured to change the polarity of the control signal only when the value of the output signal corresponds with the negatively-sloped portion of the predetermined periodic wavelength-transmissivity intensity characteristic.

4. The system of claim 1, wherein:

said wavelength monitor includes a divider configured to divide the laser light from the light-emitting device into a first portion and a second portion, a first light receiving element positioned to receive the first portion of said laser light, and configured to produce a first electrical signal, a second light receiving element positioned to receive the second portion of said laser light, and configured to produce a second electrical signal; and said optical filter being positioned to receive only one of said first portion and said second portion of said laser light.

5. The system of claim 4, wherein:

wherein said predetermined criteria being a predetermined voltage; and said control unit includes a comparator configured to produce a differential voltage from said first electrical signal and said second electrical signal and compare said differential voltage against the predetermined voltage, and a drive signal generator configured to produce a drive signal as said control signal for controlling an operation of said temperature regulator based on a value of said differential voltage in relation to said predetermined voltage.

6. The system of claim 5, wherein:

said drive signal generator is a current generator configured to produce said drive signal with a predetermined amount of electrical current based on the value of said differential voltage in relation to said predetermined voltage.

7. The system of claim 1, wherein:

said optical filter comprises a Fabry-Perot etalon filter.

8. The system of claim 1, wherein:

said predetermined periodic wavelength-transmissivity intensity characteristic of said optical filter is set to have one cycle be approximately two times a wavelength spacing of adjacent channels in a wavelength division multiplex communication system.

9. The system of claim 1, wherein:

said switch being processor-controlled.

10. The system of claim 9, wherein:

said switch being a software programmable switch implemented by executing computer-readable instructions on a processor.

11. A method for controlling a wavelength of a laser light comprising:

outputting laser light from a light-emitting device;

controllably regulating a temperature of said light-emitting device with a temperature regulator;

filtering at least a portion of the laser light from said light-emitting device with an optical filter having a predetermined periodic wavelength-transmissivity intensity characteristic;

receiving at a wavelength monitor the at least a portion of the laser light after being filtered by said optical filter and producing an output signal as a function of said predetermined periodic wavelength-transmissivity intensity characteristic, said output signal having a positively sloped portion and a negatively sloped portion as a function of wavelength;

providing a control signal from a control unit for controlling said temperature regulator in response to receiving said output signal of said wavelength monitor, said control signal have a polarity, said control unit configured to perform a control function based only on one of the positively sloped portion and said negatively sloped portion of said output signal but not both,; and switching a polarity of polarity of the control signal applied to the temperature regulator when a value of the output signal meets a predetermined criteria of having a slope that is opposite to a slope on which the control unit is configured to perform the control function.

12. The method of claim 11, wherein:

said predetermined periodic wavelength-transmissivity intensity characteristic of said optical filter includes a positively sloped portion and a negatively sloped portion; and said switching step includes changing the polarity of the control signal only when the value of the output signal corresponds with the positively-sloped portion of the predetermined periodic wavelength-transmissivity intensity characteristic.

13. The method of claim 11, wherein:

said predetermined periodic wavelength-transmissivity intensity characteristic of said optical filter includes a positively sloped portion and a negatively sloped portion; and said switching step includes changing the polarity of the control signal only when the value of the output signal corresponds with the negatively-sloped portion of the predetermined periodic wavelength-transmissivity intensity characteristic.

14. The method of claim 11, further comprising steps of:

dividing the laser light from the light-emitting device into a first portion and a second portion, producing a first electrical signal at a first light receiving element positioned to receive the first portion of said laser light; and producing a second electrical signal at a second light receiving element positioned to receive the second portion of said laser light, wherein
said filtering step includes filtering with said optical filter only one of said first portion and said second portion of said laser light.

15. The method of claim 14, wherein:

said providing step includes
producing a differential voltage from said first electrical signal and said second electrical signal and comparing said differential voltage against a predetermined voltage, and producing as said control signal a drive signal for controlling an operation of said temperature regulator based on a value of said differential voltage in relation to said predetermined voltage.

16. The method of claim 15, wherein:

said producing as said control signal a drive signal step includes producing said drive signal with a predetermined amount of electrical current based on the value of said differential voltage in relation to said predetermined voltage.

17. The method of claim 11, wherein:

said filtering step includes filtering with a Fabry-Perot etalon filter.

18. The method of claim 11, wherein:

said filtering step includes filtering with the optical filter having the predetermined periodic wavelength-transmissivity intensity characteristic set to have one cycle be approximately two times a wavelength spacing of adjacent channels in a wavelength division multiplex communication system.

19. The method of claim 11, wherein:

said switching step includes switching said polarity under control of a programmable processor.

20. A system for controlling a wavelength of a laser light comprising:

a light-emitting device configured to output the laser light;

a temperature regulator configured to controllably regulate a temperature of said light-emitting device;

an optical filter positioned in a transmission path of at least a portion of the laser light from said light-emitting device, said optical filter having a predetermined periodic wavelength-transmissivity intensity characteristic;

a wavelength monitor positioned to receive the at least a portion of the laser light after being passed through said optical filter and configured to produce an output signal as a function of said predetermined periodic wavelength-transmissivity intensity characteristic, said output signal having a positively sloped portion and a negatively sloped portion as a function of wavelength;

a control unit configured to perform a control function based only on one of the positively sloped portion and said negatively sloped portion of said output signal but not both, said control unit configured to provide a control signal for controlling said temperature regulator in response to receiving said output signal of said wavelength monitor, said control signal have a polarity; and means for switching a polarity of the control signal applied to the temperature regulator when a value of the output signal meets a predetermined criteria of having a slope that is opposite to a slope on which the control unit is configured to perform the control function.

21. The system of claim 20, wherein:

said predetermined periodic wavelength-transmissivity intensity characteristic of said optical filter includes a positively sloped portion and a negatively sloped portion; and said means for switching includes means for changing the polarity of the control signal only when the value of the output signal corresponds with the positively-sloped portion of the predetermined periodic wavelength-transmissivity intensity characteristic.

22. The system of claim 20, wherein:

said predetermined periodic wavelength-transmissivity intensity characteristic of said optical filter includes a positively sloped portion and a negatively sloped portion; and said means for switching includes means for changing the polarity of the control signal only when the value of the output signal corresponds with the negatively-sloped portion of the predetermined periodic wavelength-transmissivity intensity characteristic.

23. The system of claim 20, further comprising:

means for dividing the laser light from the light-emitting device into a first portion and a second portion;

means for producing a first electrical signal at a first light receiving element positioned to receive the first portion of said laser light; and means for producing a second electrical signal at a second light receiving element positioned to receive the second portion of said laser light, wherein
said optical filter is positioned to filter only one of said first portion and said second portion of said laser light.

24. The system of claim 23, wherein:

said control unit includes
means for producing a differential voltage from said first electrical signal and said second electrical signal and comparing said differential voltage against a predetermined voltage, and means for producing as said control signal a drive signal for controlling an operation of said temperature regulator based on a value of said differential voltage in relation to said predetermined voltage, as said predetermined criteria.

25. The system of claim 24, wherein:

said means for producing as said control signal a drive signal includes means for producing said drive signal with a predetermined amount of electrical current based on the value of said differential voltage in relation to said predetermined voltage.

26. The system of claim 20, wherein:

said optical filter being a Fabry-Perot etalon filter.

27. The system of claim 20, wherein:

said optical filter having the predetermined periodic wavelength-transmissivity intensity characteristic set to have one cycle be approximately two times a wavelength spacing of adjacent channels in a wavelength division multiplex communication system.

* * * * *